United States Patent [19]

Irving et al.

[11] 3,837,856

[45] Sept. 24, 1974

[54] METHOD FOR REMOVING PHOTORESIST IN MANUFACTURE OF SEMICONDUCTOR DEVICES

[75] Inventors: Stephen M. Irving, Cupertino; Kyle E. Lemons, San Jose, both of Calif.

[73] Assignee: Signetics Corporation, Sunnyvale, Calif.

[22] Filed: Sept. 22, 1972

[21] Appl. No.: 291,246

Related U.S. Application Data

[63] Continuation of Ser. No. 49,613, June 25, 1970, abandoned, which is a continuation of Ser. No. 4,165, Jan. 15, 1970, abandoned, which is a continuation of Ser. No. 628,425, April 4, 1967, abandoned.

[52] U.S. Cl. .......... 96/36.2, 96/35, 96/36

[51] Int. Cl. .......... G03c 5/00

[58] Field of Search .......... 96/35, 36, 36.2, 119

[56] References Cited

UNITED STATES PATENTS

| | | | |
|---|---|---|---|
| 3,443,944 | 5/1969 | Wise | 96/36.2 |
| 3,542,550 | 11/1970 | Conrad et al. | 96/34 |

OTHER PUBLICATIONS

Hollahan, John R., "Analytical Applications of Electrodelessly Discharged Gases" J. Chem. Ed. vol. 43, No. 5; May 1966, pg. A401–A416.

*Primary Examiner*—Ronald H. Smith
*Assistant Examiner*—Richard L. Schilling
*Attorney, Agent, or Firm*—Flehr, Hohbach, Test, Albritton & Herbert

[57] ABSTRACT

Dry method for removing photoresist utilizing gases excited by electrodeless radio frequency excitation, commonly called glow discharge in the manufacture of semiconductor devices.

3 Claims, 1 Drawing Figure

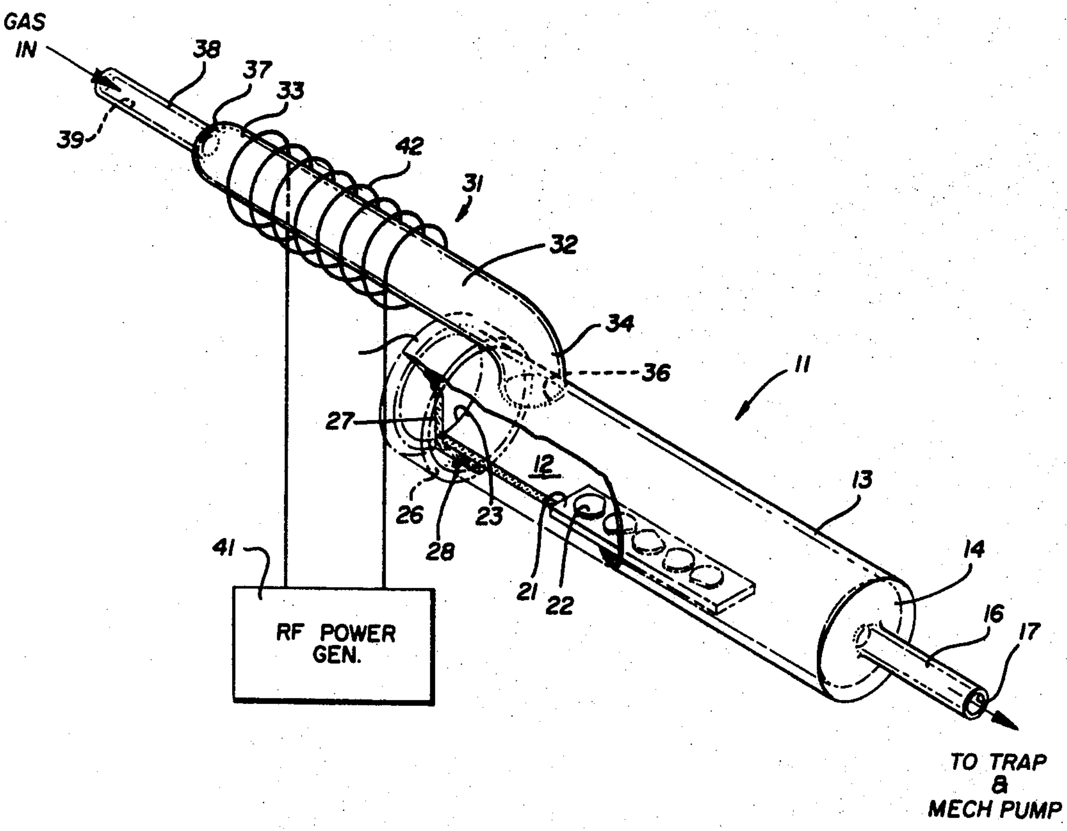
INVENTORS
Stephen M. Irving
BY Kyle E. Lemons
Flehr, Hohbach, Test, Albritton & Herbert
Attorneys

METHOD FOR REMOVING PHOTORESIST IN MANUFACTURE OF SEMICONDUCTOR DEVICES

CROSS-REFERENCE TO RELATED APPLICATION

This is a continuation of application Ser. No. 49,613, filed June 25, 1970, now abandoned, which is a continuation of Ser. No. 4,165 filed 1/15/70, now abandoned, which is a continuation of parent application Ser. No. 628,425 filed 4/4/67, now abandoned.

BACKGROUND OF THE INVENTION

This invention relates to a method for removing photoresist. As is well known to those skilled in the art, photoresist is a partially polymerized suspension in organic fluids of polymers such as cinnamic acid, esters or any of several types of polymers used in the production of patterns. The photoresist is normally applied in a liquid form on substrates and then spun off to a thin film. Thereafter, it is dried. The photoresist is then generally exposed through a grid to sensitize a pattern and the undesired portions of the photoresist are removed by development. The desired patterns are etched into the substrate utilizing the remaining photorsist as a mask. The etched substrate is then washed in deionized water or some other type of solvent. This normally completes the etching operation and the remaining photoresist is then removed. In the past, this has been accomplished by utilizing certain types of materials. One type which is utilized is a mixture of chromic oxide in concentrated sulphuric acid which is normally heated. The wafers or substrates carrying the photoresist to be removed are normally immersed in this hot solution with or without stirring until the photoresist has either lifted off or decomposed. After this has been accomplished, the wafers or substrates are washed and may be subject to further treatment. The utilization of such a solution is dangerous to handle because it oxidizes rapidly. It also has a relatively short life because it decomposes rapidly which necessitates frequent changes. Even during use over a short time, the efficiency of the solution drops off very rapidly and often all of the photoresist is not removed and small bits of photoresist may remain on the substrate or wafer. If this occurs, the devices which are made, utilizing such substrates or wafers are subject to failure. In addition, such removal may leave chromium residues which may have detrimental effects on subsequent processing.

SUMMARY OF THE INVENTION

The method for removing photoresist from a substrate consists of creating a gas having active species therein and covering this gas to come into contact with at least portions of the photoresist on the substrate for a sufficient period of time to remove all of said portions of the photoresist from the substrate.

In general, it is an object of the present invention to provide a method whereby photoresist can be easily and readily removed from substrates.

Another object of the invention is to provide a method of the above character in which the photoresist can be removed at a relatively low temperature.

Another object of the invention is to provide a method of the above character in which the photoresist is removed without leaving undesirable inorganic residues.

Additional objects and features of the invention will appear from the following description with the preferred embodiments set forth in detail in conjuction with the accompanying drawing.

BRIEF DESCRIPTION OF THE DRAWING

The drawing shows an isometric view with certain portions schematically illustrated of an apparatus for removing photoresist utilizing the method incorporating the present invention.

DESCRIPTION OF THE PREFERRED EMBODIMENT

The apparatus used for removing photoresist and forming the present method consists of means 11 which forms a first chamber 12. The means which forms the chamber can be of any desired conformation and can be formed of any suitable material. For example, it can be in the form of a hollow cylinder 13 formed of glass which is provided with an end wall 14 which closes one end of the cylinder. A tube 16 is mounted in the end wall and is provided with a passage 17 which is in communication with the chamber 12 within the cylinder 13. As shown in the drawing, the tube 16 is normally connected to a trap which is utilized to keep impurities out of the chamber 12 and to a mechanical pump which is provided for placing a vacuum in the chamber 12 which can range from $10^{-3}$ to $10^{2}$ mm. of mercury.

The chamber 12 within the cylinder 13 should be of a sufficient size so that it can receive a boat or plate 21 which is utilized for carrying the wafers or substrates 22 from which the photoresist is to be removed. The other end of the cylinder 13 is provided with a large opening 23 through which the boat 21 carrying the substrates 22 can be inserted. A large cap 24 is provided for closing the opening 23 and is also formed of a suitable material such as glass. The cap 24 is formed by an annulus 26 and a circular plate 27 mounted on one end of the annulus. The annulus 26 is provided with an O-ring 28 so that a suitable seal is formed between the cap 24 and the open end of the cylinder 13.

Means 31 is also provided for forming a second chamber 32. As shown in the drawing, this means consists of a cylinder 33 also formed of a suitable material such as glass. Means is provided for establishing communication between the first chamber 12 and the second chamber 32 and, as shown in the drawing, is formed by a continuation of the cylinder 33 in which a right angle bend 34 is provided and is joined to the side wall forming the cylinder 13 so that it is in communication with a hole 36 provided in the side wall of the cylinder 13. The other end of the cylinder 33 is closed by a rounded end wall 37. An inlet tube 38 is mounted in the end wall 37 and is provided with a flow passage 39 which is in communication with the second chamber 32. The gas which is to be utilized in the apparatus is supplied through the passage 29.

Means is provided for exciting the gases within the chamber 32 by electrodeless radio frequency and consists of a radiofrequency power generator 41 of a conventional type which supplies the radio frequency energy to a discharge coil 42 which is helical in form and surrounds the cylinder 33. The generator 41 can have a suitable discharge power such as 300 watts. The coil 42 is concentric with the cylinder 33 and extends longitudinally of the cylinder 33. The coil 42 can be of a conventional type such as a silver-plated wound copper coil.

Operation and use of the apparatus in performing the present method may now be briefly described as follows. Let it be assumed that the mechanical pump is operating and that it is placing a partial vacuum in the chambers 12 and 32 within an optimum range of 0.1 to 10 mm. of mercury, and typically 1 mm. of mercury. Let it also be assumed that the gas which is to be utilized in the apparatus is being supplied through the inlet passage 39. Any one of a number of gases can be utilized such as oxygen, nitrogen, hydrogen and helium. Oxygen, by way of example, has been found to perform quite satisfactorily.

As the gas which is being utilized is bled into the chamber 32 at a controlled rate, the gas passes into the field created by the coil 42 being supplied with the radio frequency energy. This radio frequency energy excites the gas and initiates a breakdown in the gas which causes energy to be coupled into the gas and to create what is called a glow discharge. It is believed that this glow discharge is comprised of a complicated plasma consisting of atoms and molecules, both neutral and ionized, in ground and excited states as well as a free electron concentration. It is also believed that in the discharge region an appreciable concentration of free atoms are generated. In the case of oxygen, a high (10 – 20%) concentration of oxygen atoms and, depending on the discharge conditions, approximately an equivalent amount of electronically excited molecular oxygen is generated. The remainder of the plasma consists of normal ground state oxygen molecules, some ionized species and the free electron concentration.

A few millimeters away from the glow region, most of the ionic species have disappeared and there is left only the "atomically active" species which persist and are carried downstream to the right as viewed in the drawing through the cylinder 32 and into the hole 36 and into the chamber 12 because of the vacuum which is being created by the mechanical pump connected to the outlet tube 16. These active species in the oxygen are atomic oxygen and molecular oxygen. The direct generation of oxygen atoms in the discharge glow region results in part from the electron molecule reactions, molecule ion electron reactions, and electronically excited molecular oxygen dissociation. The production of a high concentration of atomic oxygen is due in large part to catalytic effects by the presence of other "foreign" gases, such as hydrogen, nitrogen, or water vapor. These impurities provide many of the kinetic pathways leading to atomic oxygen production. The impurity level of commercially available oxygen is sufficient to give the desired catalytic activity for production of atomic oxygen in the desired quantities.

As the gas carrying the active species enters the chamber 12, it impinges upon the exposed surfaces of the substrates or wafers 22. It decomposes or oxidizes the photoresist on the substrates by a chemical reaction which is exothermic. During this chemical reaction, the photoresist is decomposed into its main volatile compounds which, along with the gases, pass through the outlet tube 16 and through the trap and are eventually exhausted through the mechanical pump connected to the outlet passage 16.

It has been found that within a relatively short time all the photoresist remaining on the substrates 22 has been completely removed by contact with the gas carrying active species to leave clean and clear surfaces on the substrate. The photoresist removal can be carried on under relatively wide varying conditions. A partial vacuum is utilized in order to ensure that primarily one particular gas is present within the chamber 12. In addition, the partial vacuum is desirable to reduce the number of atoms in the chamber so that there is not a self-quenching effect upon the active species carried by the gas from the glow discharge region. The process can be carried out within a relatively wide range of temperatures and is normally carried out at the temperature of the plasma plus any additional temperature rise occurring due to the temperatures of the plasmas varies in accordance with the gas used. For oxygen it is approximately 80°C and for nitrogen it is in excess of 200°C. During the process, there may be a temperature rise of the wafers or substrates within the chamber from room temperature to 100° to 120°C using hydrogen or oxygen. In any event, the temperature should be below the temperature which causes substantial redistribution of any deposits in the substrate during the time required for removal of the photoresist.

By way of example, it has been found that it is possible to remove photoresist having a thickness of approximately one-half micron within 3 to 5 minutes using excited oxygen. With photoresists having different thicknesses or varying compositions or using gases other than oxygen, it may take as much as 10 to 15 minutes to remove all of the photoresist.

It is apparent from the foregoing that there has been provided a method whereby photoresist can be readily and rapidly removed from wafers with complete assurance that the surfaces of the substrates, when they are removed from the apparatus, will be free and clear of any photoresist, making it possible to substantially increase the yield of semiconductor devices made utilizing such wafers or substrates. The method has the distinct advantage that it eliminates the need for dangerous and unstable solutions for removing photoresist.

We claim:

1. In a method for manufacturing semiconductor devices utilizing a semiconductor substrate having a generally planar surface with deposits in the substrate, applying photoresist to the surface of the substrate, the photoresist being of a type formed of an organic photosensitive polymer mixture, exposing certain portions of the photoresist to form a pattern, developing the photoresist to remove the undesired portions of the photoresist, operating on the semiconductor substrate using the remaining photoresist as a mask, placing the semiconductor substrate within a chamber, creating by electrodeless radio frequency a gas having an active species therein, and causing the gas having active species therein to contact with at least portions of the remaining photoresist on the semiconductor substrate for a sufficient period of time to remove by chemical reaction all of said portions of the photoresist from the semiconductor substrate with a temperature rise in the substrate which is below a temperature causing substantial redistribution of deposits in the semiconductor substrate.

2. A method as in claim 1 together with the step of creating the gas having active species therein within a portion of the chamber spaced a substantial distance from the substrate and wherein the gas having the active species therein is moved into the region in which the substrate is disposed, said chamber being under a vacuum ranging from $10^{-3}$ to $10^{2}$ mm. of mercury.

3. A method as in claim 2 wherein the substrate does not rise to a temperature above 150°C.

* * * * *